(12) United States Patent
Park et al.

(10) Patent No.: US 8,012,845 B2
(45) Date of Patent: Sep. 6, 2011

(54) INSULATING FILM PATTERN, METHOD FOR MANUFACTURING THE SAME, AND METHOD FOR MANUFACTURING THIN FILM TRANSISTOR SUBSTRATE USING THE SAME

(75) Inventors: Dae-Jin Park, Incheon (KR); Kyu-Young Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 298 days.

(21) Appl. No.: 12/423,542

(22) Filed: Apr. 14, 2009

(65) Prior Publication Data

US 2010/0078644 A1 Apr. 1, 2010

(30) Foreign Application Priority Data

Sep. 26, 2008 (KR) .................. 10-2008-0094787

(51) Int. Cl.
 *H01L 21/76* (2006.01)
(52) U.S. Cl. ............... 438/406; 438/455; 438/458
(58) Field of Classification Search ........... 438/406, 438/455, 458
 See application file for complete search history.

(56) References Cited

U.S. PATENT DOCUMENTS

| | | | | |
|---|---|---|---|---|
| 2005/0164494 | A1* | 7/2005 | Nakagawa et al. | 438/637 |
| 2006/0258163 | A1* | 11/2006 | Ohashi et al. | 438/735 |
| 2008/0286449 | A1* | 11/2008 | Park | 427/123 |
| 2008/0318170 | A1* | 12/2008 | Lin et al. | 430/324 |
| 2009/0057960 | A1* | 3/2009 | Kashiwagi | 264/488 |

FOREIGN PATENT DOCUMENTS

| | | |
|---|---|---|
| JP | 2007-129227 | 5/2007 |
| KR | 10-2006-0121404 | 11/2006 |
| KR | 10-2007-0059688 | 6/2007 |

\* cited by examiner

*Primary Examiner* — Thien F Tran
(74) *Attorney, Agent, or Firm* — H.C. Park & Associates, PLC (57) ABSTRACT

In an insulating film pattern, a first pattern part is formed at one surface of the insulating film pattern to form a source electrode, a drain electrode, and a semiconductor layer of the thin film transistor. The first pattern part is recessed in one surface of the insulating film pattern. The insulating film pattern is formed on a substrate through an imprint scheme, and is deposited on a base substrate having a gate electrode and a gate line through a contact print scheme. A source electrode, drain electrode, and semiconductor layer of a thin film transistor are formed through an inkjet print scheme using a first pattern part of the insulating film pattern. A gate electrode and gate line may be formed using a second pattern part of the insulating film pattern.

3 Claims, 12 Drawing Sheets

Fig. 10B

INSULATING FILM PATTERN, METHOD FOR MANUFACTURING THE SAME, AND METHOD FOR MANUFACTURING THIN FILM TRANSISTOR SUBSTRATE USING THE SAME

CROSS-REFERENCE TO RELATED APPLICATION

This application claims priority from and the benefit of Korean Patent Application No. 10-2008-0094787, filed on Sep. 26, 2008, which is hereby incorporated by reference for all purposes as if fully set forth herein.

BACKGROUND OF THE INVENTION

1. Field of the Invention

The present invention relates to an insulating film pattern, a method for manufacturing the insulating film pattern, and a method for manufacturing a thin film transistor substrate using the insulating film pattern. More particularly, the present invention relates to an insulating film pattern that may improve the productivity and simplify the manufacturing of a thin film transistor, a method for manufacturing the insulating film pattern, and a method for manufacturing a thin film transistor substrate using the insulating film pattern.

2. Discussion of the Background

In general, a display apparatus is used to display images by changing data from an electrical format into images visible to human eyes. A liquid crystal display (LCD) is one type of display apparatus and displays images using optical characteristics of liquid crystals.

In detail, the LCD includes an LCD panel that displays images and a backlight assembly that provides light to the LCD panel. The LCD panel includes a thin film transistor (TFT) substrate, an opposite substrate facing the TFT substrate, and a liquid crystal layer interposed between the TFT substrate and the opposite substrate.

The TFT substrate includes pixels serving as a basic unit to display the image, and each pixel has a TFT to turn a pixel voltage on and off, and a pixel electrode. The pixel electrode is connected to a drain electrode of the TFT, and receives the pixel voltage from the TFT.

The TFT substrate has a multilayer structure including thin films, so the TFT substrate is generally formed by patterning the thin films through a photolithography process using expensive masks, so that the process time and manufacturing cost are greater than desired.

SUMMARY OF THE INVENTION

This invention provides an insulating film pattern that may improve the productivity and simplify the manufacturing of a TFT.

This invention also provides a method for manufacturing an insulating film pattern.

This invention also provides a method for manufacturing a TFT substrate using an insulting film pattern.

Additional features of the invention will be set forth in the description which follows, and in part will be apparent from the description, or may be learned by practice of the invention.

The present invention discloses an insulating film pattern including a first surface having a first pattern part to form a source electrode, a drain electrode and a semiconductor layer of a thin film transistor, and a second surface facing the first surface. Further, the first pattern part includes a source pattern that extends in a first direction and is recessed in the insulating film pattern to form the source electrode, a drain pattern that is spaced apart from the source pattern and is recessed in the insulating film pattern to form the drain electrode, and a semiconductor pattern that is arranged between the source pattern and the drain pattern and is recessed in the insulating film pattern to form the semiconductor layer.

The present invention also discloses a method for manufacturing an insulating film pattern. The method includes forming a resist layer on an upper surface of a substrate, aligning an imprint apparatus with the resist layer, the imprint apparatus including an etching pattern, bonding the imprint apparatus to the substrate with the resist layer interposed between the imprint apparatus and the substrate, forming a first pattern part on a surface of the resist layer by the etching pattern, the first pattern part comprising a source pattern, a drain pattern, and a semiconductor pattern, and separating the imprint apparatus from the substrate with the resist layer having the first pattern part as an insulating film pattern bonded to the imprint apparatus.

The present invention also discloses a method for manufacturing a thin film transistor substrate. The method includes depositing on an upper surface of a base substrate an insulating film pattern having a first pattern part on an upper surface of the insulating film pattern, the first pattern part having a source pattern, a drain pattern, and a semiconductor pattern recessed in the insulating film pattern, forming a source electrode and a drain electrode of a thin film transistor through an inkjet print scheme using the source pattern and the drain pattern, forming a gate insulting film by etching a portion of the insulting film pattern, and forming a semiconductor layer of the thin film transistor through an inkjet print scheme using the semiconductor pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, mechanically or electrically, or intervening elements or layers may be present. In contrast, when an element is referred to as being "directly on" or "directly connected to" another element or layer, there are no intervening elements or layers present.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Hereinafter, embodiments of the present invention will be described in detail with reference to accompanying drawings.

Figure 1:
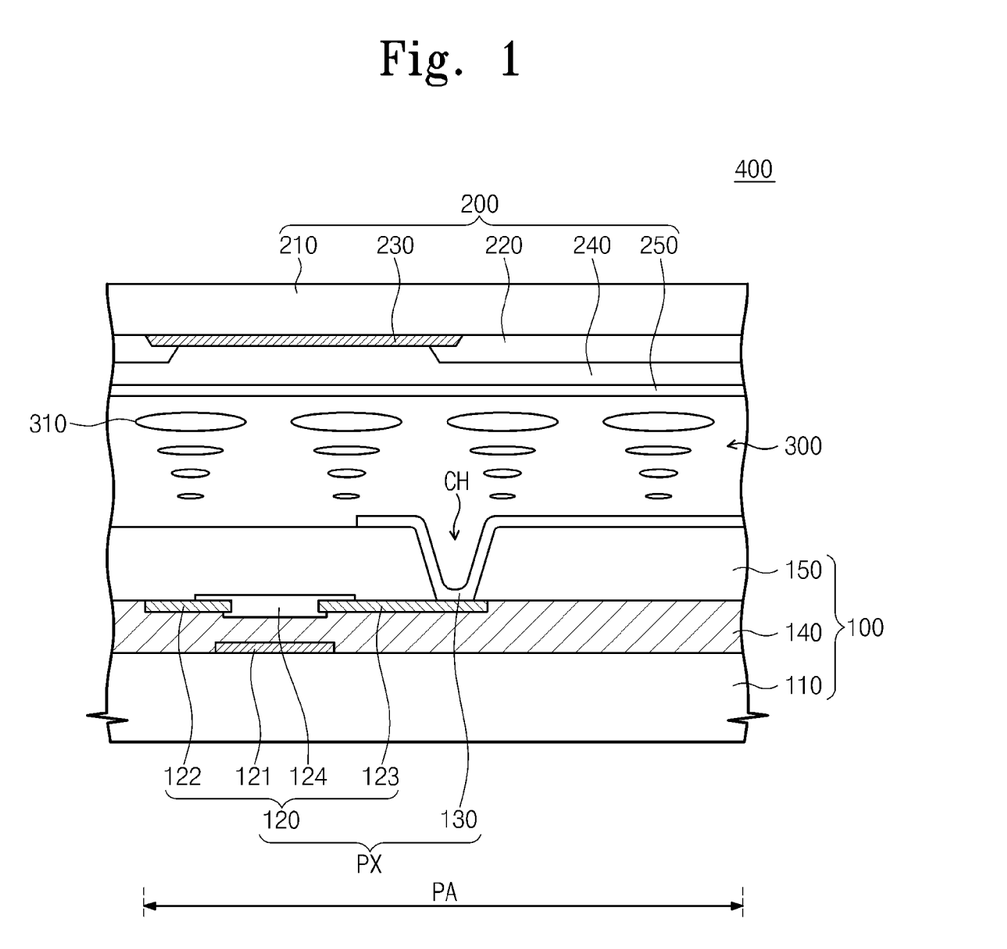
FIG. 1 is a sectional view illustrating an LCD panel according to an exemplary embodiment of the present invention.
Figure 2:
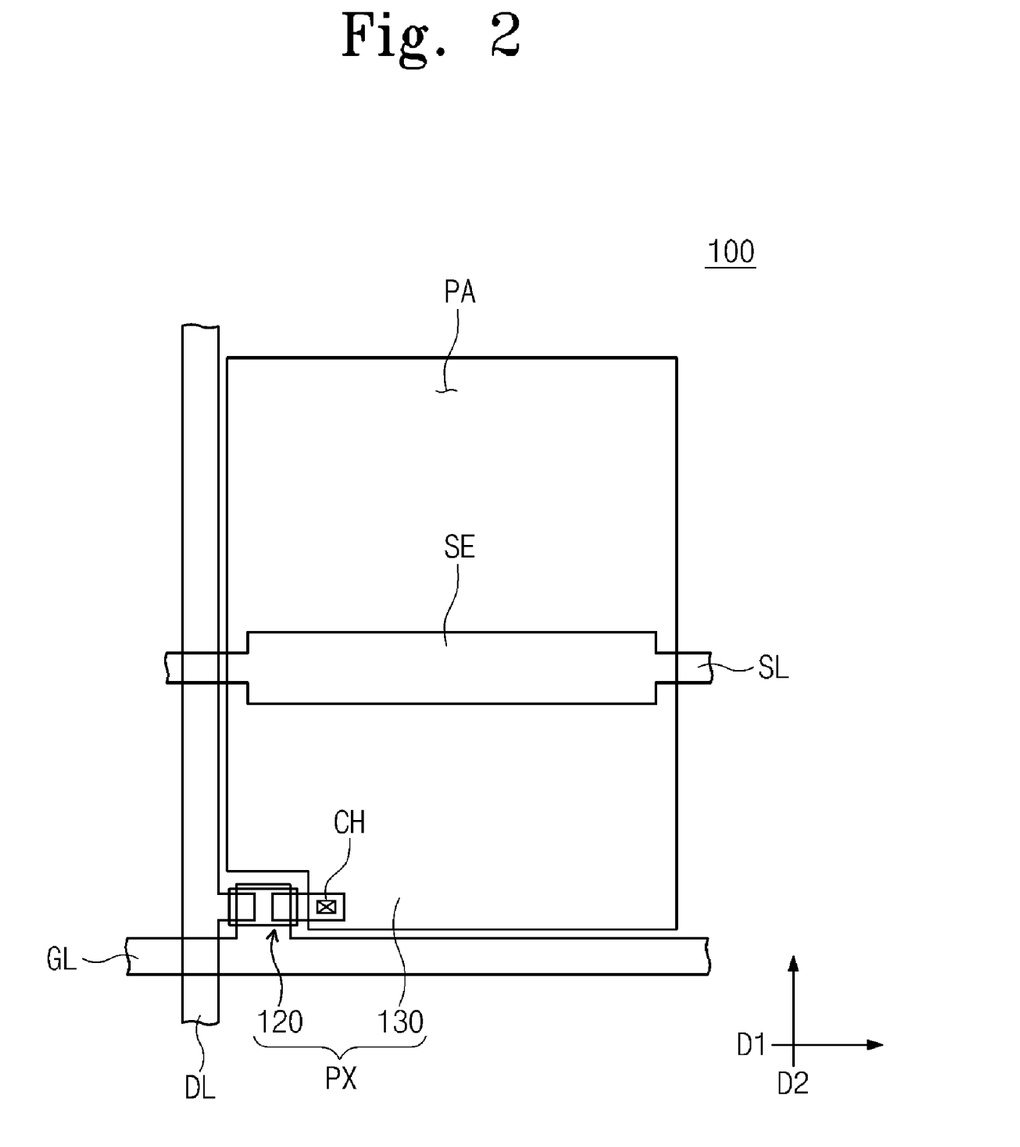
FIG. 2 is a plan view illustrating a TFT substrate shown in FIG. 1.

FIG. 1 is a sectional view illustrating an LCD panel according to an exemplary embodiment of the present invention, and FIG. 2 is a plan view illustrating the TFT substrate 100 shown in FIG. 1.

Referring to FIG. 1 and FIG. 2, an LCD 400 includes a TFT substrate 100, an opposite substrate 200 facing the TFT substrate 100, and a liquid crystal layer 300 interposed between the TFT substrate 100 and the opposite substrate 200. The liquid crystal layer 300 includes liquid crystals 310.

The TFT substrate 100 includes a first base substrate 110, a gate line GL, a data line DL, a pixel part PX, and a gate insulating film 140.

A pixel area PA is a region on the first base substrate 110, and includes a region in which images are displayed.

The gate line GL is arranged on an upper surface of the first base substrate 110 and extends in a first direction D1 to transmit a gate signal. The data line DL is arranged on the first base substrate 110. The data line DL is insulated from the gate line GL and crosses with the gate line GL. The data line DL also extends in a second direction D2 substantially perpendicular to the first direction D1. The data line DL and the gate line GL define the boundaries of the pixel area PA.

The pixel part PX is arranged in the pixel area PA. The pixel part PX includes a TFT 120 to provide a pixel voltage according to whether the TFT 120 is on or off, and a pixel electrode 130 to receive the pixel voltage from the TFT 120.

In more detail, the TFT 120 includes a gate electrode 121, a source electrode 122, a drain electrode 123, and a semiconductor layer 124. The gate electrode 121 extends from the gate line GL, and the source electrode 122 extends from the data line DL to at least partially overlap with the gate electrode 121. The drain electrode 123 faces the source electrode 122 with the semiconductor layer 124 interposed therebetween. The semiconductor layer 124 is arranged in a region corresponding to the gate electrode 121 and may partially cover an upper surface of the source electrode 122 and an upper surface of the drain electrode 123. In addition, the semiconductor layer 124 may partially cover a lower surface of the source electrode 122 and a lower surface of the drain electrode 123.

The pixel electrode 130 is connected to the drain electrode 123 to receive the pixel voltage. The pixel electrode 130 may include transparent conductive material such as Indium Zinc Oxide (IZO) or Indium Tin Oxide (ITO).

The gate insulating film 140 is arranged on the upper part of the first base substrate 110 on which the gate line GL and the gate electrode 121 are formed. The gate insulating film 140 may includes organic insulating material and covers the gate line GL and the gate electrode 121. The date line DL, the source electrode 122, the drain electrode 123 and the semiconductor layer 124 are arranged on an upper surface of the gate insulating film 140. The upper surfaces of the source electrode 122 and the drain electrode 123 may be positioned lower than the upper surface of the gate insulating film 140, and the gate insulating film 140 may cover a side surface of the source electrode 122 and a side surface of the drain electrode 123.

The TFT substrate 100 further includes a protection film 150. The protection film 150 is arranged on an upper part of the gate insulating film 140 to cover the data line DL, the source electrode 122, the drain electrode 123, and the semiconductor layer 124. A contact hole CH is arranged in the protection film 150 to expose the drain electrode 123. The pixel electrode 130 is arranged on an upper surface of the protection film 150 and is connected to the drain electrode 123 through the contact hole CH.

In addition, the TFT substrate 100 further includes a storage line SL to transmit a storage voltage and a storage electrode SE. The storage line SL and the storage electrode SE may be formed of the same material as the gate line GL, and may be formed during a process or step of forming the gate line GL. Although not shown in FIG. 1, the storage line SL and the storage electrode SE may be arranged on the same layer as the gate line GL. The storage line SL extends in the first direction D1, and the storage electrode SE extends from the storage line SL in the second direction D2 on the pixel area PA.

The opposite substrate 200 is provided opposite to the TFT substrate 100. The opposite substrate 200 includes a second base substrate 210, a color filter 220, a black matrix 230, an overcoat layer 240, and a common electrode 250.

In more detail, the second base substrate 210 faces the first base substrate 110, and the color filter 220 and the black matrix 230 are arranged on a lower surface of the second base substrate 210 to face the first base substrate 110. The color filter 220 is arranged in the pixel area PA and filters out predetermined colors of light from light passing through the color filter 220. The black matrix 230 blocks light and is arranged adjacent to the color filter 220 on the second base substrate 210. The overcoat layer 240 is arranged on the black matrix 230 and the color filter 220 to planarize the opposite substrate 200. The common electrode 250 is arranged on a lower surface of the overcoat layer 240 to receive a common voltage.

The liquid crystal layer 300 is interposed between the TFT substrate 100 and the opposite substrate 200. Transmittance of light passing through the liquid crystal layer 300 is adjusted according to an electric field, which is generated between the pixel electrode 130 and the common electrode 250 and affects the alignment of the liquid crystals 310 in the liquid crystal layer 300, and the light is provided to the color filter 220.

Figure 3:
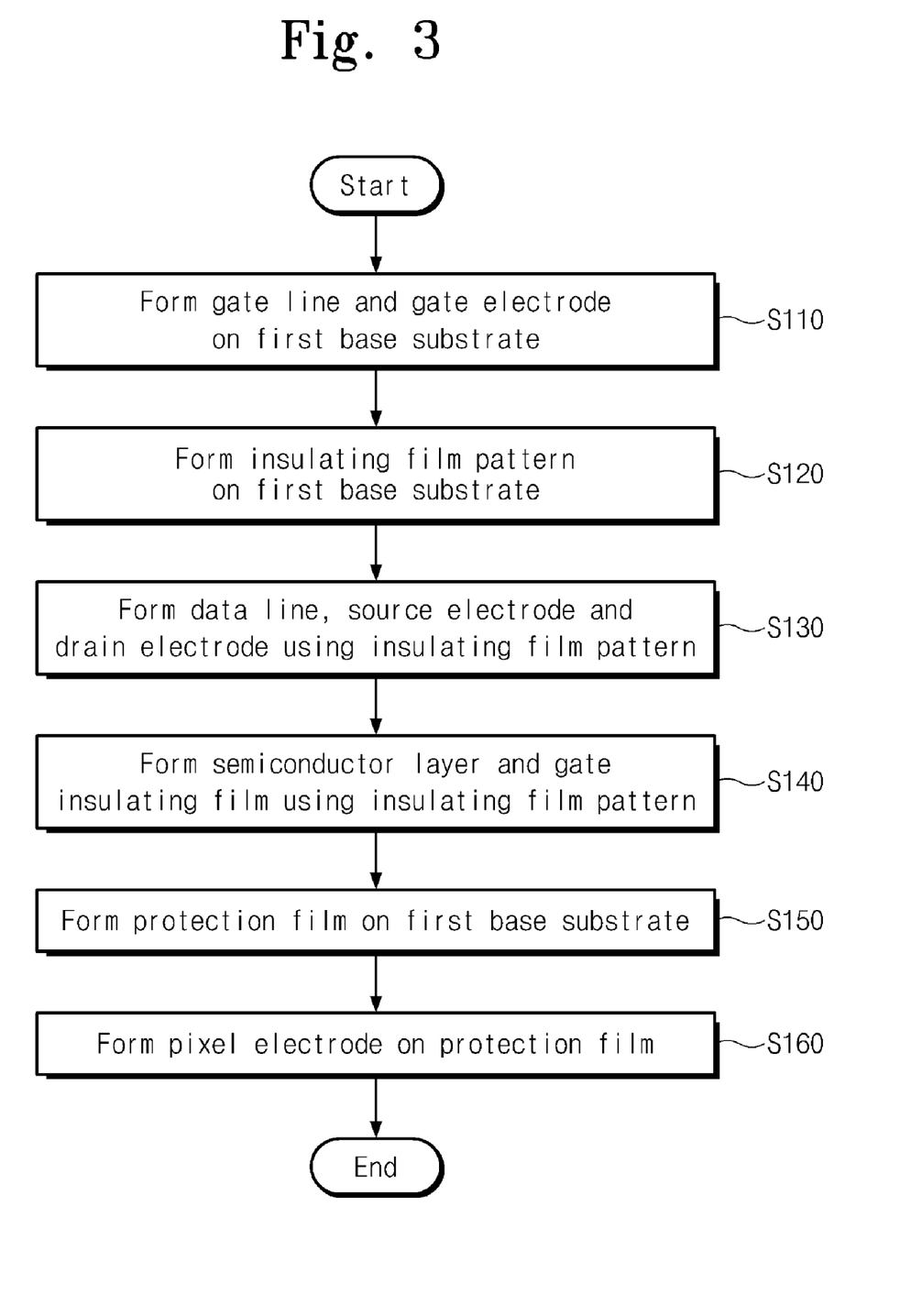
FIG. 3 is a flowchart showing a method for manufacturing a TFT substrate according to an exemplary embodiment of the present invention.

FIG. 3 is a flowchart showing a method for manufacturing a TFT substrate according to an exemplary embodiment of the present invention.

Referring to FIG. 1, FIG. 2, and FIG. 3, the gate line GL and the gate electrode 121 are formed on the first base substrate 110 (S110).

An insulating film pattern 501 is then formed on the first base substrate 110 (S120). The structure of the insulating film pattern 501 and the process of forming the insulating film pattern 501 will be described below in more detail with reference to FIG. 4, FIG. 5A, and FIG. 5B.

The data line DL, the source electrode 122, and the drain electrode 123 may be formed through an inkjet print scheme using the insulating film pattern 501 (S130). Then, the semiconductor layer 124 and the gate insulating film 140 are formed using the insulating film pattern 501 (S140). As a result, the TFT 120 is formed on the first base substrate 100.

The process of forming the TFT 120 and the gate insulating film 140 using the insulating film pattern 501 will be described below in more detail with reference to FIG. 6A, FIG. 6B, FIG. 6C, FIG. 6D, and FIG. 6E.

Then, the protection film 150 is formed on the first base substrate 100 (S150), and the pixel electrode 130 is formed on the protection film 150 (S160).

Hereinafter, the method for manufacturing the insulating film pattern 501 and the method for manufacturing the TFT 120 using the insulating film pattern 501 will be described in more detail with reference to the drawings.

Figure 4:
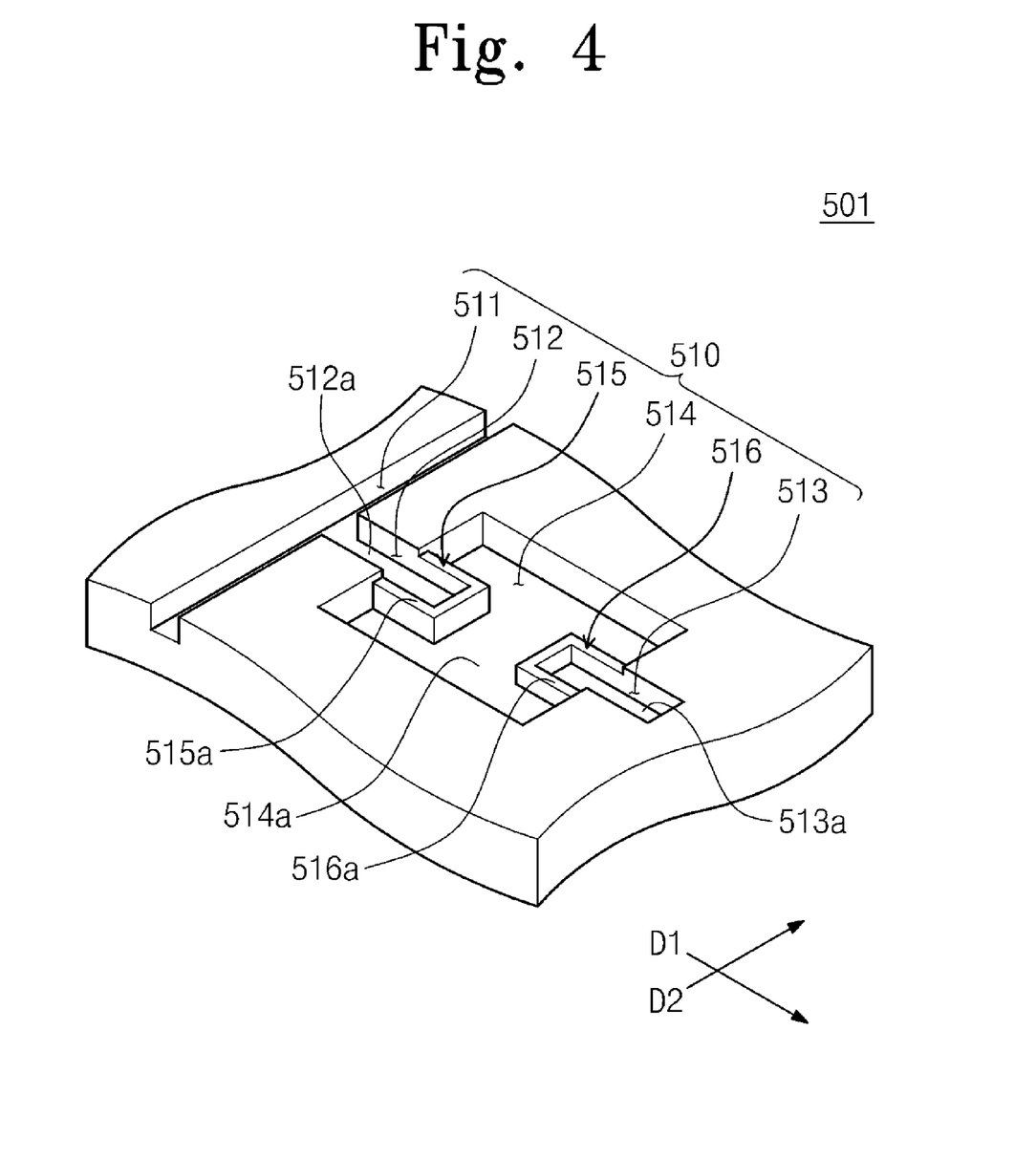
FIG. 4 is a perspective view illustrating a portion of an insulating film pattern used to manufacture the TFT substrate shown in FIG. 3.

FIG. 4 is a perspective view illustrating a portion of the insulating film pattern 501 used to manufacture the TFT substrate 100 shown in FIG. 3.

Referring to FIG. 2 and FIG. 4, the insulating film pattern 501 may include organic insulating material, and a first pattern part 510 is arranged on an upper surface of the insulating film pattern 501.

The first pattern part 510 includes a first line pattern 511 used to form the data line DL (see FIG. 1), a source pattern 512 used to form the source electrode 122, a drain pattern 513 used to form the drain electrode 123, and a semiconductor pattern 514 used to form the semiconductor layer 124.

The first line pattern 511, the source pattern 512, the drain pattern 513, and the semiconductor pattern 514 are recessed in the upper surface of the insulating film pattern 501.

In more detail, the first line pattern 511 extends in the second direction D2 and the source pattern 512 extends from the first line pattern 511 in the first direction D1. The drain pattern 513 faces the source pattern 512 with the semiconductor pattern 514 interposed there between, and extends in the first direction D1.

When viewed in a plan view, the semiconductor pattern 514 has a generally I-shape elongated in the first direction D1. A middle part of the semiconductor pattern 514 contacts an end of the source pattern 512 and an end of the drain pattern 513, and the middle part has a width that is less than a distance between two ends of the semiconductor pattern 514 facing each other in the second direction D2.

In addition, the semiconductor pattern 514 is recessed deeper into the insulating film pattern 501 than the source pattern 512 and the drain pattern 513. That is, the first line pattern 511, the source pattern 512, and the drain pattern 513 have substantially the same depth, and the semiconductor pattern 514 has a depth greater than that of the source pattern 512. As a result, if the semiconductor layer 124 (see FIG. 1) is formed through the inkjet print scheme, the deposited amount of liquid-phase semiconductor material may be more easily controlled, and the semiconductor layer 124 may be formed more precisely.

As described above, bottom surfaces 512a and 513a, which define a lower surface of the source pattern 512 and the drain pattern 513, respectively, are positioned higher than a bottom surface 514a that defines a lower surface of the semiconductor pattern 514. For this reason, if the source electrode 122 and the drain electrode 123 are formed through the inkjet print scheme, the liquid-phase metal dropped in the source pattern 512 and the drain pattern 513 might be introduced into the semiconductor pattern 514.

To prevent the liquid-phase metal from being introduced into the semiconductor pattern 514, the first pattern part 510 also includes a first partition wall 515 and a second partition wall 516. The first partition wall 515 is arranged between the source pattern 512 and the semiconductor pattern 514, and protrudes from the bottom surface 512a to surround an end of the source pattern 512. Accordingly, when the source electrode 122 is formed, the amount of ink dropped to form the source electrode 122 can be more easily controlled and the source electrode 122 can be formed more precisely because of the first partition wall 515.

In an exemplary embodiment of the present invention, a distance from the bottom surface 512a to an upper surface 515a of the first partition wall 515 is less than a distance from the bottom surface 512a to the upper surface of the insulating film pattern 501.

The second partition wall 516 is arranged between the drain pattern 513 and the semiconductor pattern 514, and protrudes from the bottom surface 513a to surround an end of the drain pattern 513. Accordingly, when the drain electrode 123 is formed, the amount of ink dropped to form the drain electrode 123 can be more easily controlled and the drain electrode 123 can be formed more precisely because of the second partition wall 516.

In an exemplary embodiment of the present invention, a distance from the bottom surface 513a to an upper surface 516a of the second partition wall 516 is less than a distance from the bottom surface 513a to the upper surface of the insulating film pattern 501.

Hereinafter, the method for manufacturing the insulating film pattern 501 through an imprint scheme will be described in more detail with reference to the drawings.

Figure 5A:
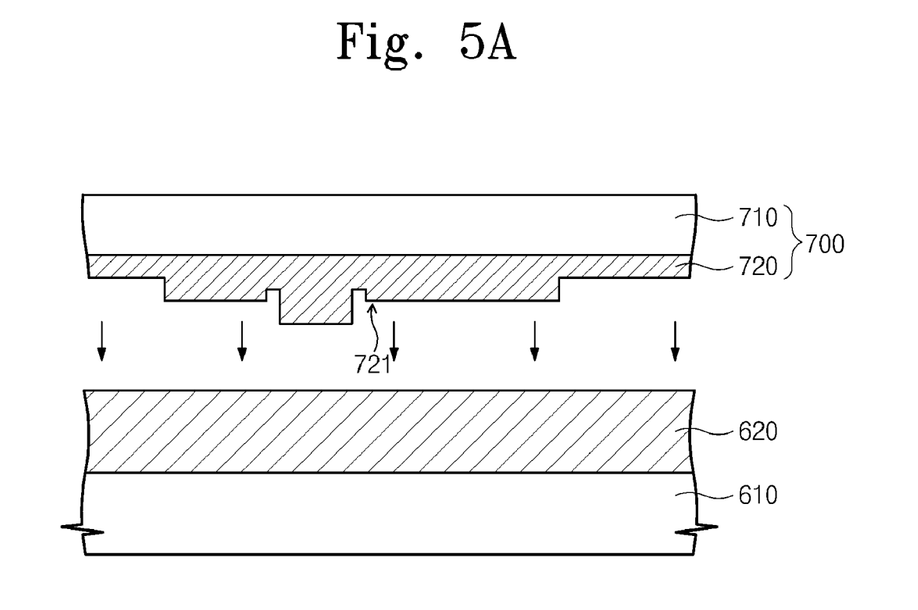
FIG. 5A and FIG. 5B are sectional views showing a method for manufacturing the insulating film pattern shown in FIG. 4.
Figure 5B:
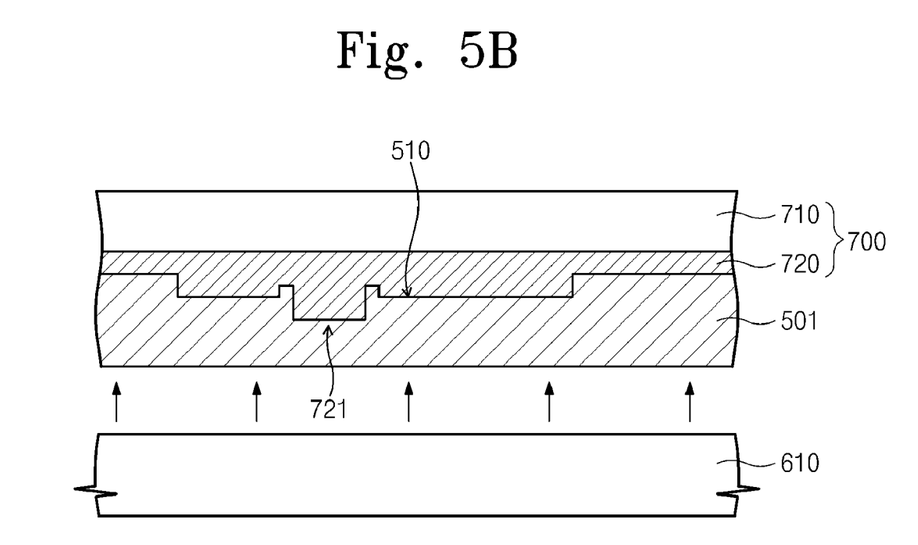

FIG. 5A and FIG. 5B are sectional views showing a method for manufacturing the insulating film pattern 501 shown in FIG. 4.

Referring to FIG. 5A, a resist layer 620, which may include an organic insulating material, is formed on a substrate 610.

An imprint apparatus 700 is disposed above the substrate 610 on which the resist layer 620 is formed. The imprint apparatus 700 includes an imprint substrate 710 and a mold layer 720 formed at one side of the imprint substrate 710. The mold layer 720 is provided with an etching pattern 721 to etch the resist layer 620.

With the imprint apparatus 700 disposed above the resist layer 620, the etching pattern 721 of the mold layer 720 is then directed downward.

Then, the imprint apparatus 700 bonds to the substrate 610 with the resist layer 620 interposed there between.

Referring to FIG. 5B, as the imprint apparatus 700 is pressed against the substrate 610, the resist layer 620 is bonded to the mold layer 720. As a result, the insulating film pattern 501 is formed from the resist layer 620, and the first pattern part 510 is formed on the upper surface of the insulating film pattern 501 in a region corresponding to the etching pattern 721.

After that, the imprint apparatus 700 is separated from the substrate 610 with the mold layer 720 bonded to the insulating film pattern 501.

Hereinafter, the method for manufacturing the TFT 120 using the insulating film pattern 501 will be described in more detail with reference to the drawings.

FIG. 6A, FIG. 6B, FIG. 6C, FIG. 6D, and FIG. 6E are sectional views showing a method for manufacturing the TFT 120 using the insulating film pattern 501 shown in FIG. 4.

Figure 6A:
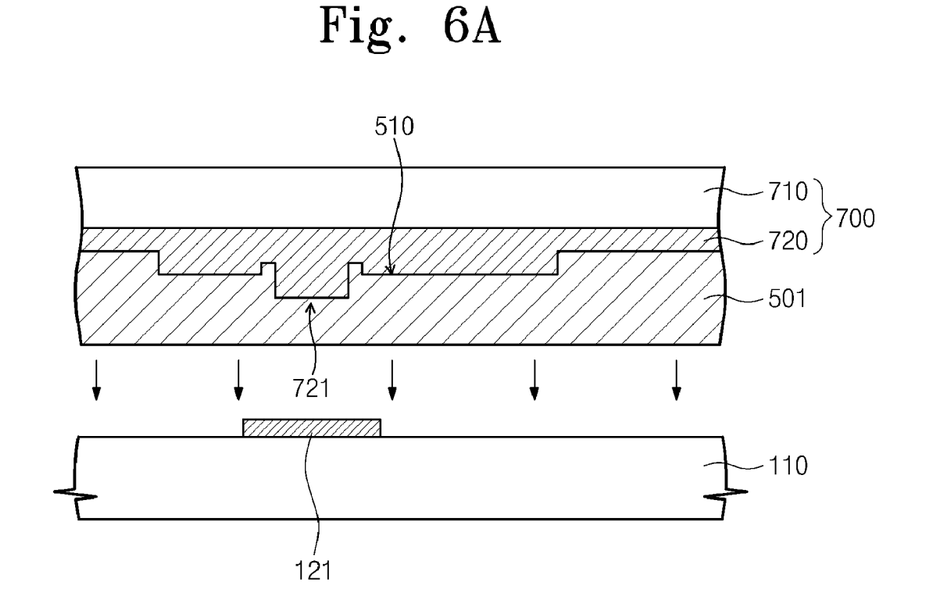
FIG. 6A, FIG. 6B, FIG. 6C, FIG. 6D, and FIG. 6E are sectional views showing a method for manufacturing a TFT using the insulating film pattern shown in FIG. 4.
Figure 6B:
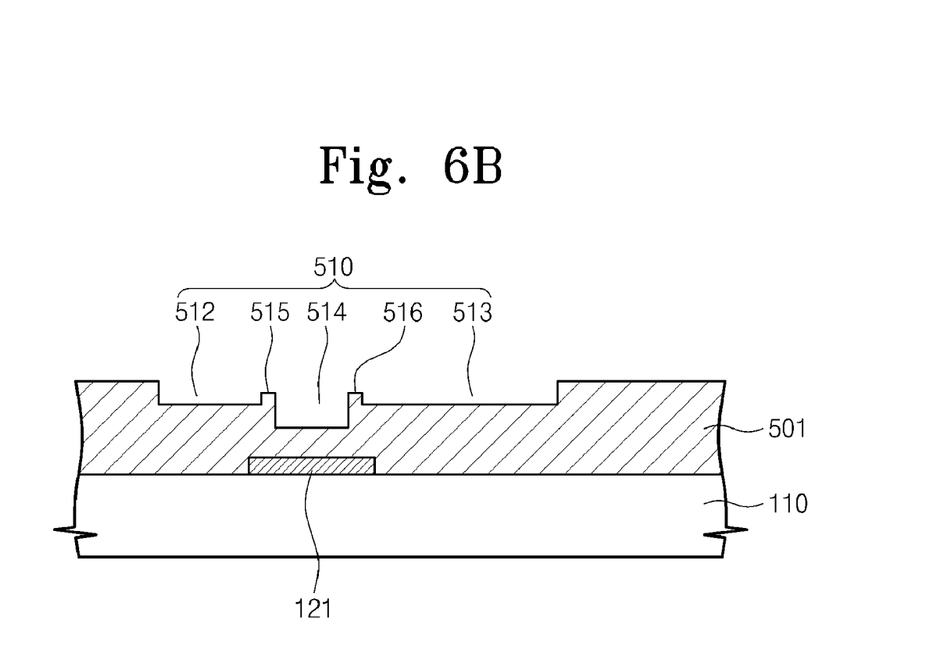

Referring to FIG. 6A and FIG. 6B, the imprint apparatus 700 bonded with the insulating film pattern 501 is disposed above the first base substrate 110 on which the gate electrode 121 is disposed. Although not shown in FIG. 6A and FIG. 6B, the gate line GL (see FIG. 2), the storage line SL (see FIG. 2) and the storage electrode SE (see FIG. 2) can be formed on the upper surface of the first base substrate 110 during a process in which the gate electrode 121 is formed.

Then, with the insulating film pattern 501 interposed between the imprint apparatus 700 and the first base substrate 110, the imprint apparatus 700 is bonded to the first base substrate 110.

After that, with the insulating film pattern 501 bonded to the first base substrate 110, the imprint apparatus 700 is separated from the first base substrate 110. Accordingly, as shown in FIG. 6B, the insulating film pattern 501 is formed on the first base substrate 110. The upper surface of the insulating film pattern 501, on which the first pattern part 510 is formed, is exposed, and the semiconductor pattern 514 of the first pattern part 510 is disposed on the gate electrode 121.

As described above, the insulating film pattern 501 is formed through the imprint scheme, and is deposited on the first base substrate 110 through a contact print scheme. Accordingly, the number of the processes to form the TFT substrate 100 can be reduced, the productivity may be improved and the manufacturing cost may be reduced by simplifying the manufacturing steps.

Figure 6C:
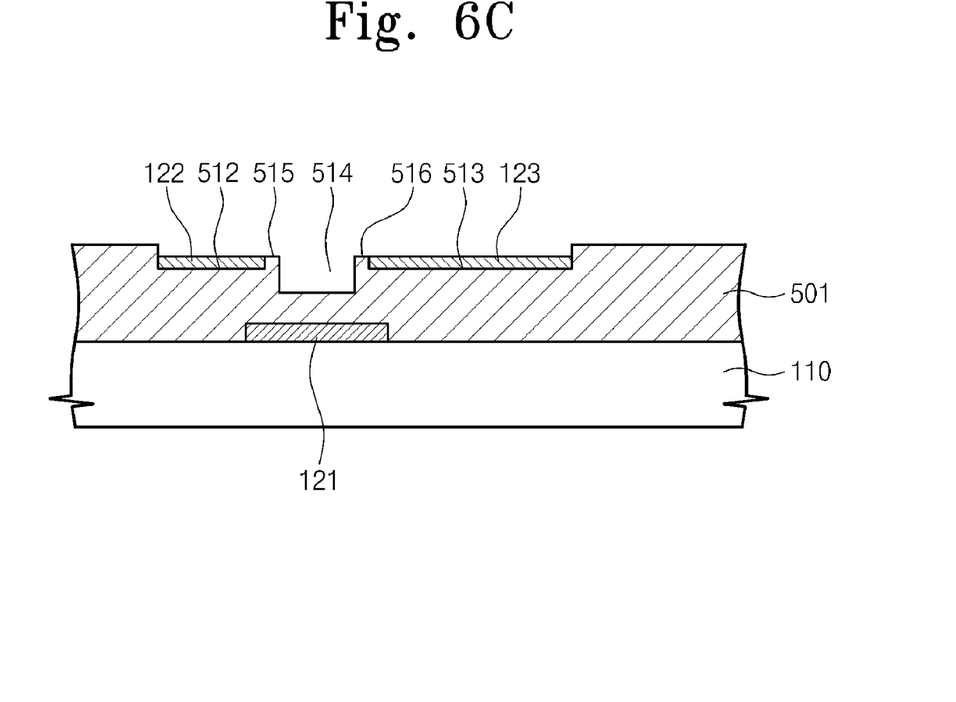

Referring to FIG. 6C, liquid-phase metal is dropped on the source pattern 512 and the drain pattern 514 of the insulating film pattern 501 to form the source electrode 122 and the drain electrode 123 on the insulating film pattern 501.

Although not shown in FIG. 6C, the data line DL (see FIG. 2) may be formed during a process or step in which the source electrode 122 and the drain electrode 123 are formed, and the data line DL may be formed using the first line pattern 511 (see FIG. 4) through the same scheme as the source electrode 122.

Figure 6D:
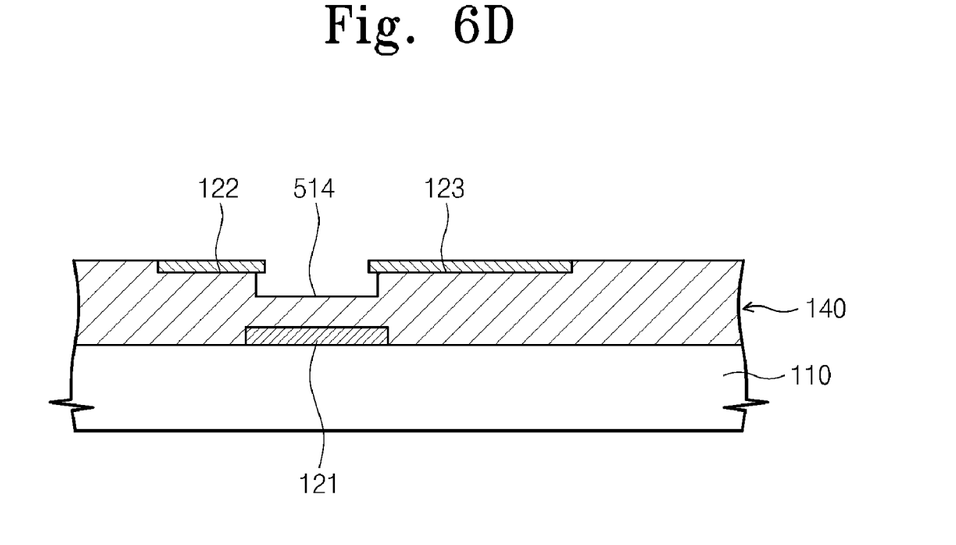
Figure 6E:
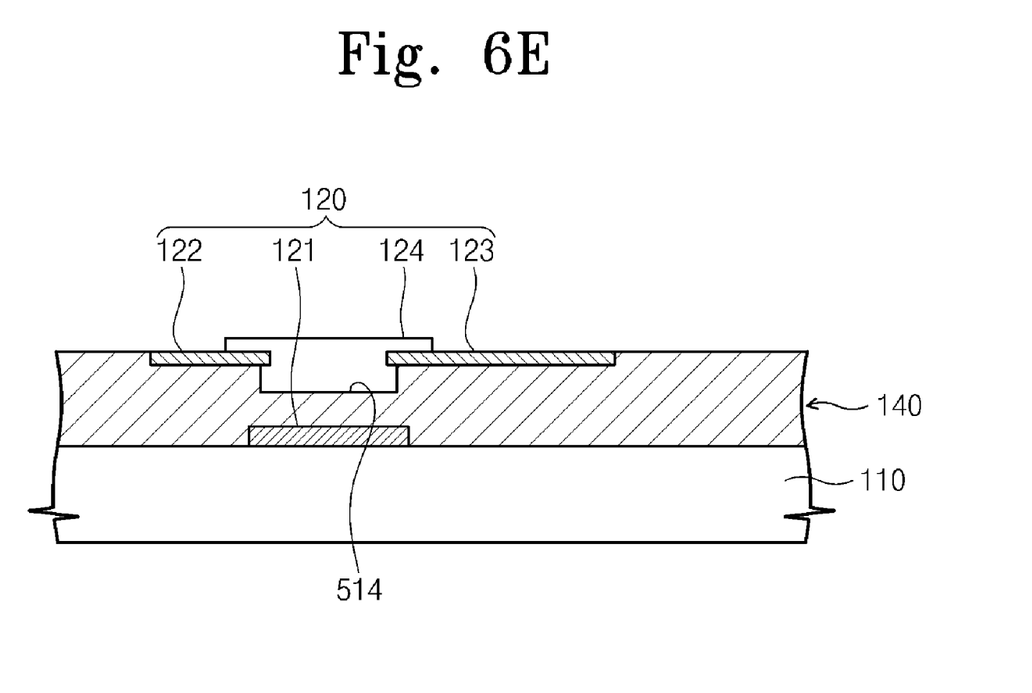

Referring to FIG. 6D and FIG. 6E, a portion of the insulting film pattern 501, including a portion near where the source electrode 122 and the drain electrode 123 are formed, undergoes an ashing process, thereby removing the first and second partition walls 515 and 516. During the ashing process, the insulating film pattern 501 is also subject to an undercut etching at a portion below the source electrode 122 and the drain electrode 123. By these steps, the gate insulating film 140 is formed on the first base substrate 110.

After that, the liquid-phase organic semiconductor material is dropped on the semiconductor pattern 514 formed in the gate insulating film 140, thereby forming the semiconductor layer 124. As a result, the TFT 120 is formed. Since the semiconductor pattern 514 is more deeply recessed than the source pattern 512 and the drain pattern 514, the amount of organic semiconductor material can be more easily controlled, and the semiconductor layer 124 can be more precisely formed.

As described above, in the TFT substrate 100, the TFT 120, and the gate insulating film 140 are formed using the insulating film pattern 501. Accordingly, the source electrode 122, the drain electrode 123, and the semiconductor layer 124 are formed through the inkjet print scheme, so that the process time may be reduced, the productivity may be improved, and the manufacturing cost may be reduced.

Figure 7:
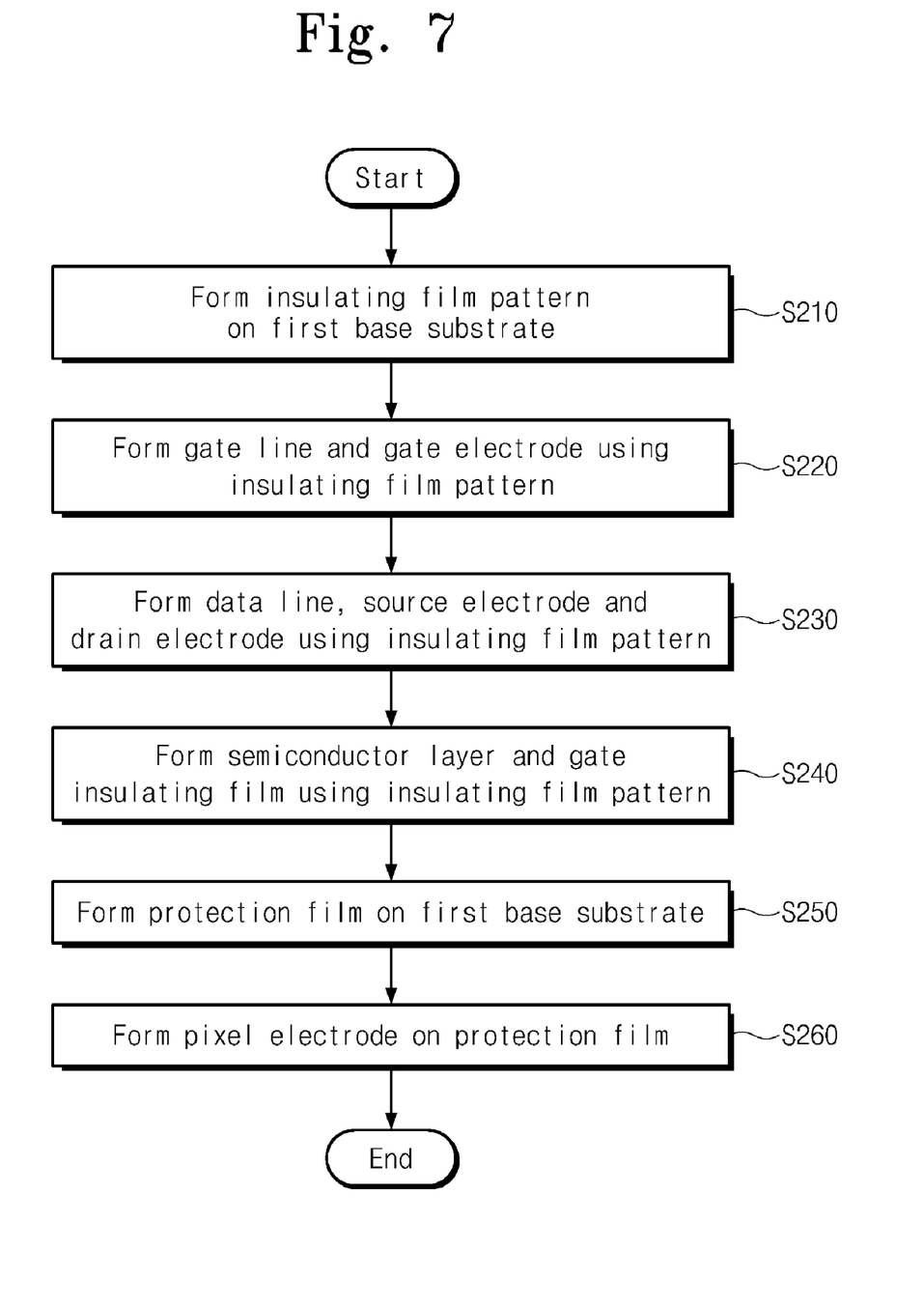
FIG. 7 is a flowchart showing a method for manufacturing a TFT substrate according to another exemplary embodiment of the present invention.

FIG. 7 is a flowchart showing a method for manufacturing the TFT substrate 100 according to another exemplary embodiment of the present invention.

Referring to FIG. 1, FIG. 2, and FIG. 7, an insulating film pattern 502 (see FIG. 8) is formed on the first base substrate 110 (S210). The structure of the insulating film pattern 502 and the method for manufacturing the insulating film pattern 502 will be described in more detail with reference to FIG. 8, FIG. 9A, and FIG. 9B.

The gate line GL and the gate electrode 121 are formed through the inkjet print scheme using the insulating film pattern 502 (S220).

The data line DL, the source electrode 122, and the drain electrode 123 are formed through the inkjet print scheme using the insulating film pattern 502 (S230).

Then, the semiconductor layer 124 and the gate insulating film 140 are formed using the insulating film pattern 502 (S240). As a result, the TFT 120 is formed on the first base substrate 100.

The process of forming the gate insulating film 140 using the insulating film pattern 502 will be explained below in reference to FIG. 10A and FIG. 10B.

Then, the protection film 150 is formed on the first base substrate 100 (S250), and the pixel electrode 130 is formed on the protection film 150 (S260).

Figure 8:
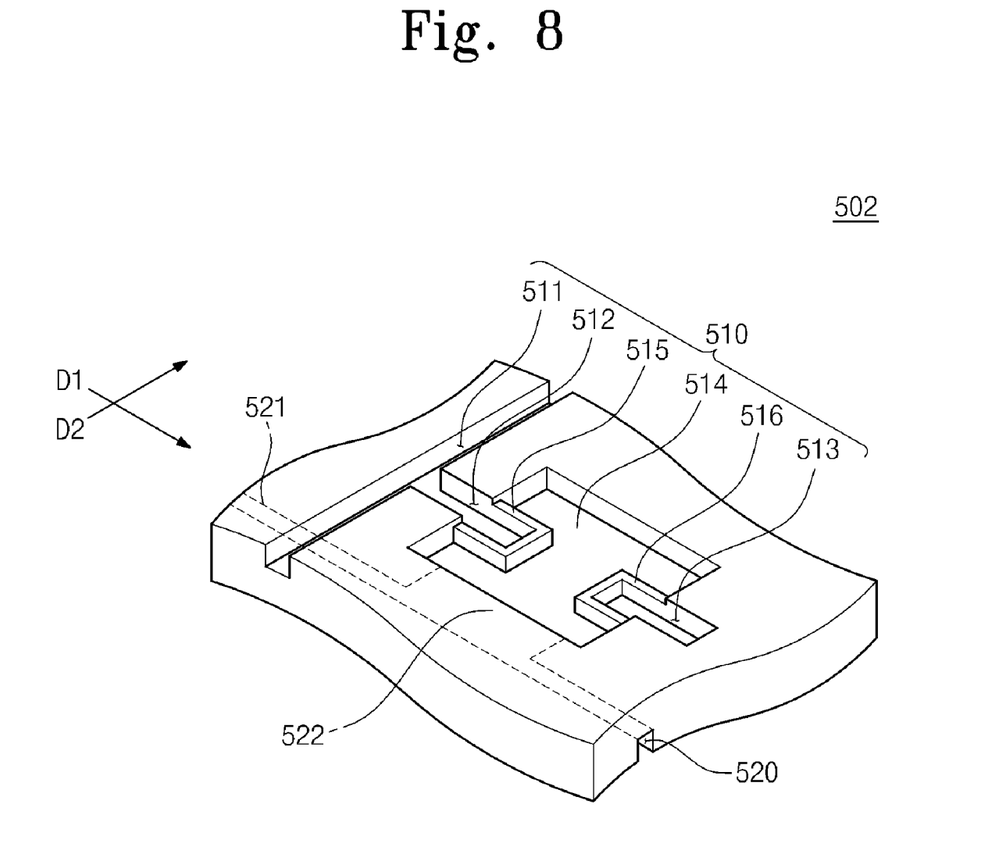
FIG. 8 is a perspective view illustrating a portion of an insulating film pattern used to manufacture the TFT substrate shown in FIG. 7.

FIG. 8 is a perspective view illustrating a portion of the insulating film pattern 502 used to manufacture the TFT substrate 100 shown in FIG. 1.

Referring to FIG. 2 and FIG. 8, the insulating film pattern 502 may include organic insulating material, and the first pattern part 510 is formed on an upper surface of the insulating film pattern 502 to form the source electrode 122, the drain electrode 123, and the semiconductor layer 124 of the TFT 120. Since the first pattern part 510 according to the present exemplary embodiment is substantially similar to the first pattern part 510 of the insulating film pattern 501 shown in FIG. 4, the same reference numerals will be used to designate the same elements, and detailed description thereof will be omitted to avoid redundancy.

In addition, a second pattern part 520 is formed at a lower surface of the insulating film pattern 502. The second pattern part 520 is recessed in the lower surface of the insulating film pattern 502 and is separated from the first pattern part 510.

In more detail, the second pattern part 520 includes a second line pattern 521 used to form the gate line GL and a gate pattern 522 used to form the gate electrode 121. The second line pattern 521 extends in the first direction D1, and crosses with the first line pattern 511 below the first pattern part 510. The gate pattern 522 extends from the second line pattern 521 and is disposed in a region below and corresponding to the semiconductor pattern 514 of the first pattern part 510.

Although not shown in FIG. 8, the second pattern part 520 may further include patterns to form the storage line SL and the storage electrode SE.

Hereinafter, the method for manufacturing the insulating film pattern 502 using the imprint scheme will be described in more detail with reference to the drawings.

Figure 9A:
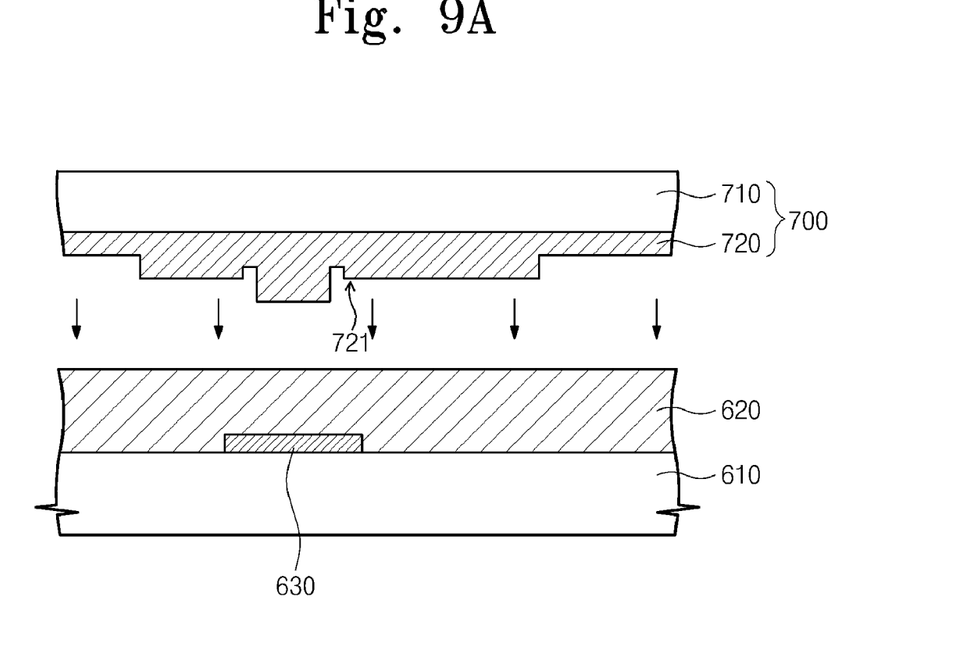
FIG. 9A and FIG. 9B are sectional views showing a method for manufacturing the insulating film pattern shown in FIG. 8.
Figure 9B:
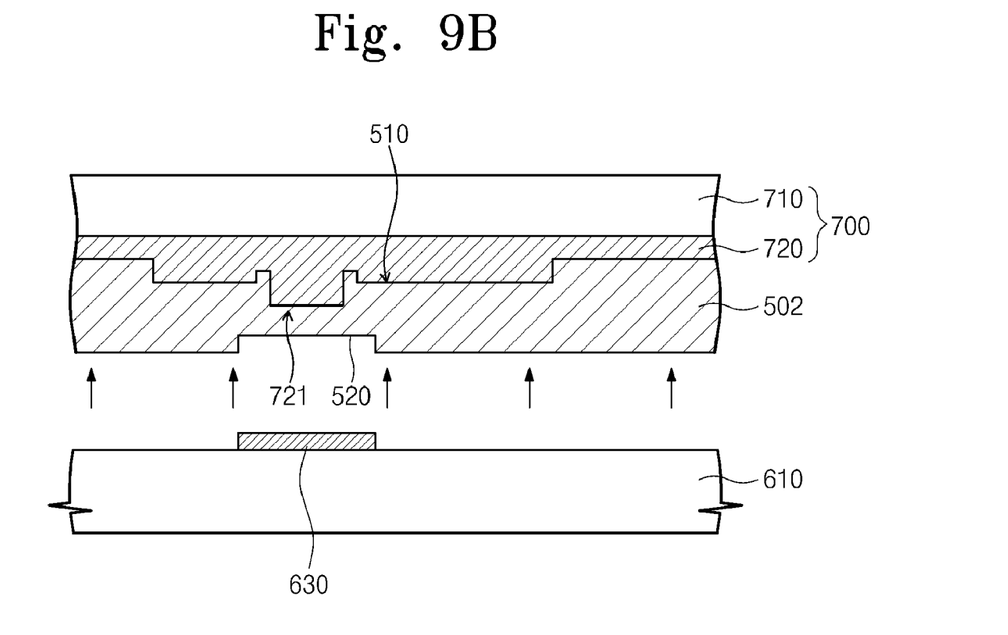

FIG. 9A and FIG. 9B are sectional views showing a method for manufacturing the insulating film pattern 502 shown in FIG. 8.

Referring to FIG. 9A, a dummy pattern 630 having a shape corresponding to the gate line GL (see FIG. 2) and the gate electrode 121 (see FIG. 1) is arranged on the substrate 610. Although not shown in FIG. 9A, if the storage line SL (see FIG. 2) and the storage electrode SE are formed together with the gate line GL and the gate electrode 121, and patterns to form the storage line SL and the storage electrode SE are included in the second pattern part 520, an additional pattern having a shape corresponding to the storage line SL (see FIG. 2) and the storage electrode SE may be arranged on the substrate 610 together with the dummy pattern 630.

Then, the resist layer 620, which may include organic insulating material, is formed on the substrate 610 on which the dummy pattern 630 is formed.

The imprint apparatus 700 is disposed above the substrate 610 on which the resist layer 620 is formed. Since the imprint apparatus 700 according to the present exemplary embodiment has a structure substantially similar to that of the imprint apparatus 700 shown in FIG. 5A, the same reference numerals will be used to designate the same elements, and detailed description thereof will be omitted to avoid redundancy.

When the imprint apparatus 700 is disposed above the resist layer 620, the etching pattern 721 of the mold layer 720 is directed downward.

Then, the imprint apparatus 700 is bonded to the substrate 610 with the resist layer 620 interposed there between.

Referring to FIG. 9B, as the imprint apparatus 700 is pressed against the substrate 610, the resist layer 620 bonds to the mold layer 720 of the imprint apparatus 700. As a result, the insulating film pattern 502 is formed, and the first pattern part 510 is formed on the upper surface of the insulating film pattern 502 in a region corresponding with the etching pattern 721.

After that, the imprint apparatus 700 is separated from the substrate 610 with the mold layer 720 bonded to the insulating film pattern 502. The insulating film pattern 502 is separated from the substrate 610 and the dummy pattern 630, so that the second pattern part 520 is formed at the lower surface of the insulating film pattern 502 by the dummy pattern 630.

Hereinafter, the method for manufacturing the TFT 120 using the insulating film pattern 502 will be described in more detail with reference to the drawings.

Figure 10A:
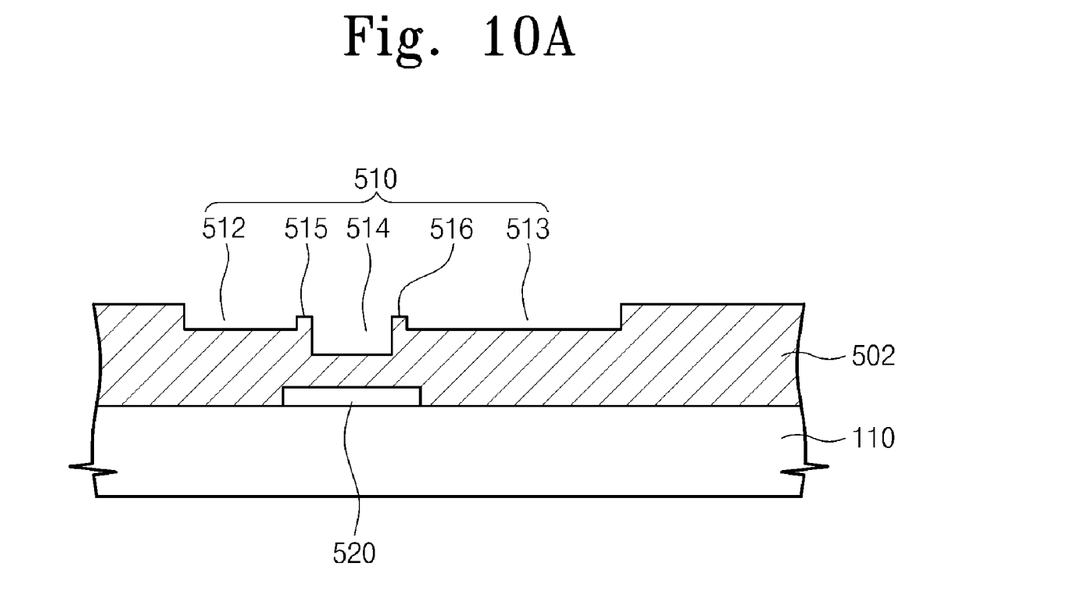
FIG. 10A and FIG. 10B are sectional views showing a method for manufacturing a TFT using the insulating film pattern shown in FIG. 8.
Figure 10B:
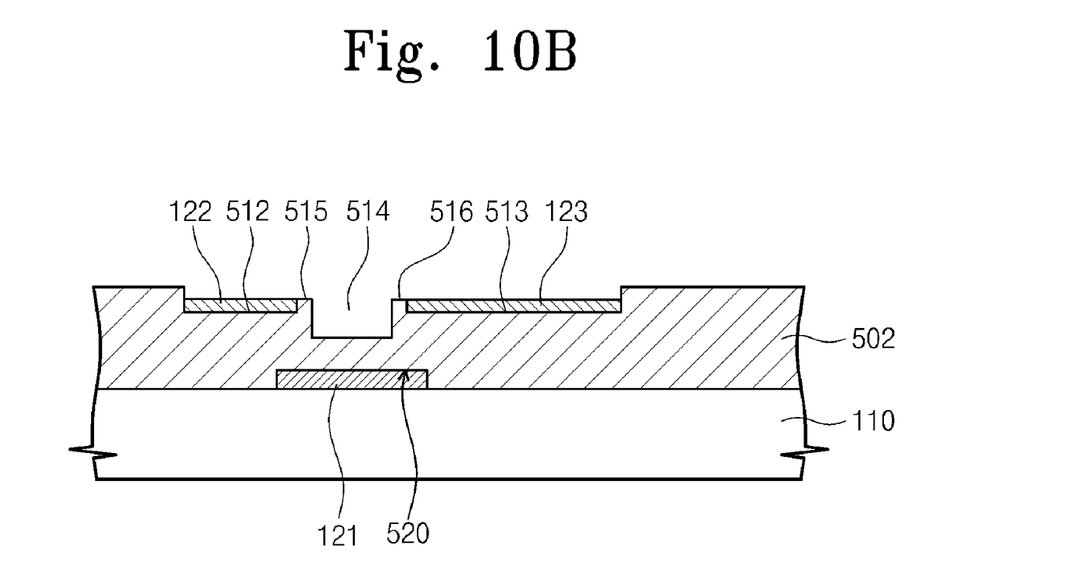

FIG. 10A and FIG. 10B are sectional views showing a process of forming the TFT 120 using the insulating film pattern 502 shown in FIG. 8.

Referring to FIG. 10A, the insulating film pattern 502 is deposited on the first base substrate 110 through the contact print scheme. Since the process of depositing the insulting film pattern 502 according to the present exemplary embodiment is substantially similar to that shown in FIG. 6A, the detailed description thereof will be omitted in order to avoid redundancy. The upper surface of the insulating film pattern 502 on which the first pattern part 510 is formed is exposed, and the lower surface of the insulating film pattern 502 on which the second pattern part 520 is formed contacts the upper surface of the first base substrate 110.

As described above, the insulting film pattern 502 is formed through the imprint scheme, and is deposited on the first base substrate 110 through the contact print scheme. Accordingly, the number of processes can be reduced, the productivity can be improved and the manufacturing cost can be reduced.

Referring to FIG. 10B, the gate electrode 121 is formed through the inkjet print scheme using the gate pattern 522 of the second pattern part 520 of the insulating film pattern 502. Liquid-phase metal is injected into a side of the insulating film pattern 502 to form the gate electrode 121.

Although not shown in FIG. 10B, the gate line GL (see FIG. 2) may be formed in a process or step of forming the gate electrode 121, and the gate line GL is formed through a similar manufacturing process as the gate electrode 121 using the second line pattern 521 (see FIG. 8) of the second pattern part 520.

Subsequently, liquid-phase metal is dropped on the source pattern 512 and the drain pattern 514 of the insulating film pattern 502 to form the source electrode 122 and the drain electrode 123, respectively.

After that, the semiconductor layer 124 (see FIG. 1) and the gate insulating film 140 (see FIG. 1) are formed. Since the process of forming the semiconductor layer 124 and the gate insulting film 140 is substantially similar to that shown in FIG. 6D and FIG. 6E, the detailed description thereof will be omitted to avoid redundancy.

As described above, in the TFT substrate 100, the TFT 120, and the gate insulating film 140 are formed using the insulating film pattern 502. Accordingly, the TFT 120 of the TFT substrate 100 is formed through the inkjet print scheme, so the process time may be reduced, the productivity may be improved, and the manufacturing cost may be reduced.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method for manufacturing an insulating film pattern, comprising:

forming a resist layer on an upper surface of a substrate;

aligning an imprint apparatus with the resist layer, the imprint apparatus comprising an etching pattern;

bonding the imprint apparatus to the substrate with the resist layer interposed between the imprint apparatus and the substrate;

forming a first pattern part on a surface of the resist layer by the etching pattern, the first pattern part comprising a source pattern, a drain pattern, and a semiconductor pattern; and separating the imprint apparatus from the substrate with the resist layer having the first pattern part as an insulating film pattern bonded to the imprint apparatus.

2. The method of claim 1, wherein the source pattern is to form a source electrode, the drain pattern is to form a drain electrode, and the semiconductor pattern is to form a semiconductor layer, and wherein the source pattern, the drain pattern, and the semiconductor pattern are recessed in an upper surface of the resist layer by the etching pattern.

3. The method of claim 1, further comprising:

forming a dummy pattern having a shape corresponding to a gate electrode of a thin film transistor and a gate line on the upper surface of the substrate before the resist layer is formed, wherein a second pattern part is formed at a lower surface of the resist layer by the dummy pattern to form a gate electrode and the gate line.

* * * * *